United States Patent [19]

Bates

[11] Patent Number: 4,568,890
[45] Date of Patent: Feb. 4, 1986

[54] MICROWAVE OSCILLATOR INJECTION LOCKED AT ITS FUNDAMENTAL FREQUENCY FOR PRODUCING A HARMONIC FREQUENCY OUTPUT

[75] Inventor: Robert N. Bates, Redhill, England

[73] Assignee: U.S. Philips Corporation, New York, N.Y.

[21] Appl. No.: 558,657

[22] Filed: Dec. 6, 1983

[30] Foreign Application Priority Data

Dec. 23, 1982 [GB] United Kingdom ............... 8236654

[51] Int. Cl.$^4$ .......................... H03B 9/14; H03B 7/14
[52] U.S. Cl. .................................. 331/96; 331/107 C; 331/107 DP; 331/172
[58] Field of Search ............ 331/96, 107 DP, 107 C, 331/117 D, 47, 55, 107 P, 172

[56] References Cited

U.S. PATENT DOCUMENTS 3,713,041 1/1973 Sakamoto et al. .......... 331/117 D X
4,222,014 9/1980 Ondria ......................... 331/107 DP
4,264,875 4/1981 Hunsperger et al. .... 331/107 DP X

FOREIGN PATENT DOCUMENTS 2710164 9/1978 Fed. Rep. of Germany .
2805254 8/1979 Fed. Rep. of Germany .

OTHER PUBLICATIONS

Lazarus et al., "Wideband Tunable MM-Wave Gunn Oscillator Design", *Electronic Letters*, Oct. 1, 1981, vol. 17, No. 20, pp. 739-741.
Oltman et al., "Subharmonically Injection Phase-- Locked Gunn Oscillator Experiments", *IEEE Transactions on Microwave Theory and Techniques*, vol. MTT-17, Sep. 1969, pp. 728-729.
Chien et al., "Subharmonically Injected Phase-Locked IMPATT-Oscillator Experiments", *Electronics Letters*, vol. 6, No. 8, Apr. 16, 1970, pp. 240-241.
Barth, "A Wideband, Backshort-Tunable Second Harmonic W-Band Gunn-Oscillator", 1981 IEEE MTT-S, International Microwave Symposium Digest, Los Angeles, CA, Jun. 15-19, 1981, pp. 334-337.

*Primary Examiner*—Siegfried H. Grimm
*Attorney, Agent, or Firm*—Robert J. Kraus

[57] ABSTRACT

A microwave oscillator suitable for millimeter wavelengths comprises a Gunn diode (3) coupled to a waveguide (1) by a resonant-cap structure (5,6). The diode (3) generates microwave energy both at a fundamental frequency $f_o$ which is below the cut-off frequency of the waveguide (1) and at a second harmonic frequency $2f_o$ above cut-off. To control the generation of microwave energy at $2f_o$, energy at $f_o$ is coupled into the waveguide (1) from an adjacent further waveguide (9) above its cut-off, by means of an electric probe (8) extending close to the cap (5). The probe (8) may couple in a locking signal at or close to the free-running value of $f_o$ from another oscillator having better noise performance and electronic tuning, thereby locking $2f_o$ to twice the frequency of the locking signal, or alternatively may couple to a varactor-tuned cavity resonant at $f_o$.

16 Claims, 5 Drawing Figures

MICROWAVE OSCILLATOR INJECTION LOCKED AT ITS FUNDAMENTAL FREQUENCY FOR PRODUCING A HARMONIC FREQUENCY OUTPUT

BACKGROUND OF THE INVENTION

This invention relates to a microwave oscillator which is particularly suitable for generating microwave energy at millimeter wavelengths, for example at frequencies above 60 GHz.

More specifically, the invention relates to a microwave oscillator comprising a waveguide having a cut-off frequency, the oscillator further comprising means, including a negative-resistance oscillator device, for generating microwave energy in the waveguide, wherein the generating means are operable to generate microwave energy simultaneously at a fundamental frequency which is below the cut-off frequency of the waveguide and at a harmonic frequency which is an integral multiple of the fundamental frequency and which is above the cut-off frequency, the generating means further comprising first means which in operation couple the oscillator device to the waveguide at the harmonic frequency and on which the values of said fundamental frequency and the harmonic frequency depend.

A typical oscillator of this type using a Gunn diode is described in the article "Oscillators Lock and Tune at W Band" by M. Crandell and F. J. Bernues, Microwave Systems News, December 1980, pages 54–60. As indicated in the article, the resonant disc (also called "resonant cap") arrangement used in the described oscillator is the preferred approach for determining the resonant properties of the millimeter wave circuit. It has been established (see, for example, "Operating Modes of Millimeter Wave Transferred Electron Oscillators" by I. G. Eddison and D. M. Brookbanks, Electronics Letters, Vol. 17, No. 3 (Feb. 5, 1981), pages 112–113, and "Wideband Waveguide System Identifies GaAs Oscillator Harmonics at 94 GHz" by W. H. Haydl, Microwave Systems News, February 1982, pages 99–103) that the negative-resistance oscillator device in such an oscillator generates microwave energy both at a fundamental frequency and at least at a second harmonic thereof. However, since the cut-off frequency of the waveguide in which the oscillator device is disposed is above the fundamental frequency, only the harmonic frequency energy can propagate along the waveguide. The disc or cap is thought to function as a radial line transformer.

For electronically tuning such an oscillator, a varactor diode cannot suitably be used in the manner that is conventional with ordinary oscillators, i.e. spaced along the waveguide from the oscillator device. On the one hand, because the basic oscillation phenomenon occurs at the fundamental frequency, coupling the varactor diode to the oscillator device only at the harmonic frequency would enable it to have very little effect on the oscillating frequencies. On the other hand, placing the varactor diode very close to the oscillator device so that they might be coupled by the evanescent mode present at the fundamental frequency would result in the varactor diode presenting a low impedance across the oscillator device and hence considerably reducing the output power. It is generally not possible to reach an acceptable compromise between a useful width of electronic tuning range and an insignificant reduction in output power.

As mentioned in the article by Crandell and Bernues, the preferred method for electronically tuning such an oscillator is to vary the bias voltage applied to the Gunn diode. However, this has the disadvantages that because of the high tuning sensitivity (e.g. 2 GHz/volt), the bias voltage must be very well regulated to minimize additional FM-noise and must be accurately controlled to achieve the desired frequency variation. Further, the power output varies significantly with the bias voltage and this method can be used to vary the frequency only at a fairly low rate.

To improve the FM-noise performance of the oscillator, the article proposes the use of a phase-locked loop; this requires the use of a considerable amount of additional equipment.

An alternative approach is described in the paper "A Wideband, Backshort-Tunable Second Harmonic W-Band Gunn-Oscillator" by H. Barth, 1981 IEEE MTT-S, International Microwave Symposium Digest, pages 334–337. This paper describes oscillators in which one or more Gunn diodes are disposed in a central portion of a rectangular waveguide, the cut-off frequency of which is below the fundamental frequency of oscillation. One end of this central portion of waveguide is connected to an output rectangular waveguide, the cut-off frequency of which is between the fundamental and second harmonic frequencies of oscillation, so that only harmonic frequency energy is coupled out; the other end of the central waveguide portion containing the diode(s) is connected to a circular waveguide which has the same cut-off frequency (below the fundamental frequency) and which contains two coaxial movable short-circuits, one within the other. The inner short-circuit is operative at the second harmonic frequency, but not the fundamental frequency, and is used in the usual manner to optimize the power output at the second harmonic frequency; the outer short-circuit can be used for mechanically varying the fundamental (and hence the second harmonic) frequency. With a single Gunn diode an electronic tuning range of 300 MHz (at a second harmonic frequency of about 90 GHz) could be obtained by varying the Gunn diode bias voltage; this range is rather small. A configuration which has a wider electronic tuning range comprises two Gunn diodes and a varactor diode spaced along the central rectangular-waveguide portion. With this configuration a tuning range of 1.5 GHz was achieved for a maximum output power variation of 3 dB. This is a rather large variation, and moreover this configuration is mechanically quite complex. Furthermore, it is desirable to improve the noise performance of the oscillator.

SUMMARY OF THE INVENTION

It is an object of the invention to provide an improved microwave oscillator.

According to the invention, a microwave oscillator as set forth in the second paragraph of this specification is characterized in that the oscillator further comprises second means, extending into the waveguide and being spaced from the first coupling means, for coupling microwave energy at the fundmental frequency from outside the waveguide to the first coupling means and thence to the oscillator device, to control the generation of microwave energy at the harmonic frequency.

Suitably, in an embodiment where the first coupling means comprises a resonant cap structure, the second coupling means comprise an electric probe extending adjacent the cap. This provides a particularly simple arrangement for empirically optimizing the extent of coupling of microwave energy at the fundamental frequency to the oscillator device (depending on the desired operating characteristics).

In such an embodiment where the waveguide is rectangular and the cap has a radial surface extending parallel to the broad walls of the waveguide, the probe may extend into the waveguide from, and normal to, a narrow wall of the waveguide. The probe may be spaced normal to the radial surface.

In such an embodiment wherein the cap is substantially a disc, wherein the oscillator device is disposed between one surface of the disc and one broad wall of the waveguide, and wherein a post extends from the other surface of the disc to the other broad wall of the waveguide, the post having a substantially smaller cross-section parallel to the broad walls than the disc, the probe preferably is disposed on the side of the disc remote from the oscillator device.

In an embodiment of the invention wherein the waveguide is terminated at one end by a short-circuit, and wherein the generating means are spaced along the waveguide from the short-circuit, the second coupling means may be longitudinally intermediate the generating means and the short-circuit.

Suitably, the second coupling means are adapted to inhibit the leakage of microwave energy at the harmonic frequency from the waveguide.

The oscillator may further comprise means for propagating a locking signal from a microwave source outside the waveguide to the second coupling means and thence via the first coupling means to the negative-resistance oscillator device, the frequency of the locking signal being approximately equal to the value of the fundamental frequency in the absence of the locking signal, thereby maintaining the harmonic frequency at the integral multiple of the frequency of the locking signal.

Subharmonic injection locking of microwave oscillators is known from the two papers "Subharmonically Injection Phase-locked Gunn Oscillator Experiments" by H. G. Oltman and C. H. Nonnemaker, *IEEE Transactions on Microwave Theory and Techniques*, Vol. MTT-17, September 1969, pages 728–729, and "Subharmonically Injected Phase-Locked IMPATT-Oscillator Experiments" by C. H. Chien and G. C. Dalman, *Electronics Letters*, Vol. 6, No. 8; Apr. 16, 1970, pages 240–241. However, in at least the second of these two papers, the locking signal was supplied directly to the oscillator diode via a low pass coaxial bias circuit; moreover, there is no suggestion in the paper that the diode generates microwave energy at a frequency below that of the desired output signal. By contrast, an oscillator of the kind to which the present invention relates generates a signal at the same frequency as the injected locking signal. This generated signal will be coupled out of the oscillator waveguide by the same path and to the same extent as the locking signal is coupled in, tending to result in a loss of power and decrease in efficiency. It is therefore desirable to be able readily to vary the extent to which the locking signal is coupled to the oscillator diode, in order to optimize the operating conditions. This would considerably complicate the design of a coaxial bias supply filter circuit (which, moreover, must substantially inhibit the propagation of energy at the desired harmonic output frequency), especially if the frequency of the locking signal is, for example, about 35 GHz or more. In at least the first of the above-mentioned two papers, the oscillator (Gunn) diode was mounted in a TEM cavity; the paper does not indicate exactly how the locking signal was coupled into this cavity, but since such a cavity does not have a cut-off frequency, there would be no great difficulty in coupling a locking signal of any appropriate frequency to the diode. However, in an oscillator embodying the invention, the waveguide is cut-off at the frequency of the locking signal. Recognizing that the injection of a locking signal at the fundamental frequency by a path other than the bias supply line would considerably ease the problem of optimizing the extent of coupling of the locking signal to the diode, the applicants have found that, contrary to general opinion, a locking signal at the fundamental frequency can be coupled into the cut-off waveguide and thence to the diode by coupling means which couple the locking signal to the means by which the diode is itself coupled to the waveguide.

Such an embodiment of the invention provides the considerable advantage for oscillators which are to operate with a second harmonic frequency corresponding to millimeter wavelengths, for example 60–100 GHz, that varactor-tuned oscillators, with an operating frequency of half that value and with good noise performance are readily available. By using such an oscillator as the source of the locking signal, the superior noise and tuning characteristics of this lower-frequency oscillator are substantially acquired, in a simple manner, by the higher-frequency oscillator. Such lower-frequency oscillators also generally have more than enough power for the purpose, permitting the use of a simple attenuator (rather than requiring a more complex non-reciprocal device) to provide isolation between the oscillators.

The source of the locking signal may be a varactor-tuned oscillator as described in our co-pending U.K. Patent Application No. 8234240 filed Dec. 1, 1982 (corresponding to U.S. patent application Ser. No. 552,634 filed Nov. 16, 1983) which can provide a tuning characteristic with an unusually good degree of linearity and little power variation using an ordinary abrupt tuning varactor.

As an alternative to the injection-locking arrangement, the oscillator may further comprise a resonant cavity having means for varying the resonant frequency thereof, microwave energy at the fundamental frequency being operably coupled between the resonant cavity and the first coupling means by the second coupling means, and the resonant frequency being approximately equal to the value of the fundamental frequency in the absence of the resonant cavity, thereby maintaining the harmonic frequency at the integral multiple of the resonant frequency. The means for varying the resonant frequency of the resonant cavity suitably comprises a varactor diode.

In the injection-locking arrangement, the propagating means may comprise, or in the cavity-tuning arrangement, the resonant cavity may comprise a second waveguide into which the second coupling means extend, the second waveguide having a cut-off frequency below the fundamental frequency. In such an embodiment wherein the waveguide is rectangular, wherein the cap has a radial surface extending parallel to the broad walls of the waveguide, and wherein the probe extends into the waveguide from a narrow wall thereof, parallel to the broad walls, the narrow wall of the first waveguide from which the electric probe extends may be common to a broad wall of the second waveguide, and the second coupling means may comprise a further electric probe extending into the second waveguide from the broad wall thereof, parallel to the narrow walls thereof.

BRIEF DESCRIPTION OF THE DRAWING

Embodiments of the invention will now be described, by way of example, with reference to the diagrammatic drawing, in which.

DESCRIPTION OF THE PREFERRED EMBODIMENTS

Figure 1:
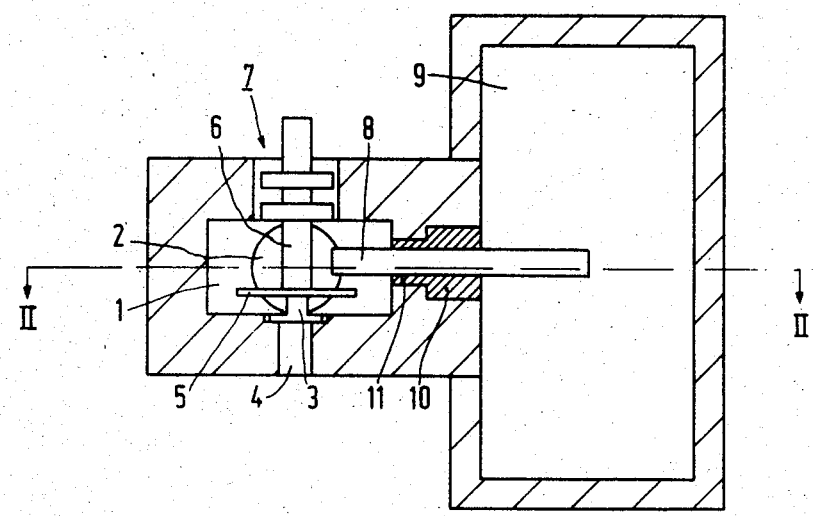
FIGS. 1 and 2 are, respectively, a transverse cross-sectional view and a longitudinal cross-sectional view of an oscillator embodying the invention, the cross-section of FIG. 1 being taken on the line I—I in FIG. 2 and the cross-section of FIG. 2 being taken on the line II—II in FIG. 1.
Figure 2:
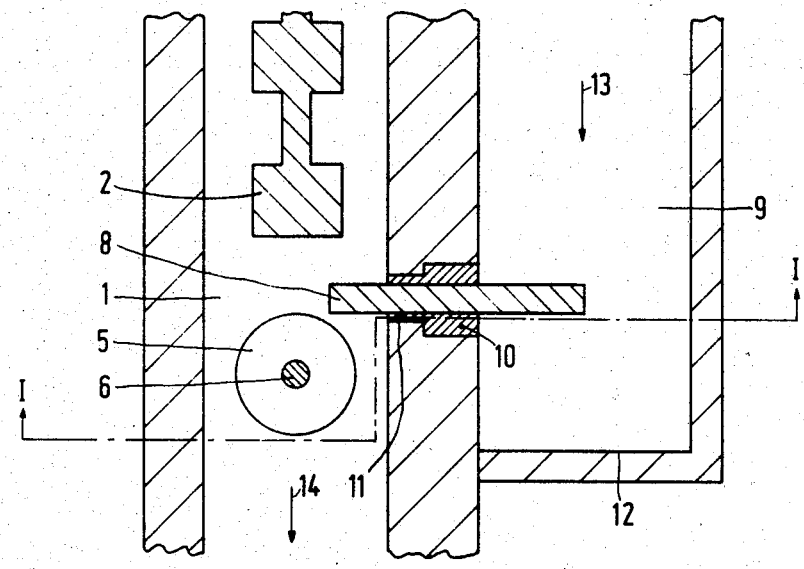

Referring to FIGS. 1 and 2, an injection-lockable microwave oscillator embodying the invention comprises a rectangular waveguide 1 of standard cross-section terminated at one end by a movable non-contacting short-circuit 2. The waveguide is of a cross-section suitable for propagating millimeter wavelengths. A Gunn diode 3 designed for oscillation at a fundamental frequency below the cut-off frequency of the waveguide 1 is mounted in a central longitudinal plane of the waveguide on a heat-sink 4 received in a bore in the lower wall of the waveguide. The diode 3 is coupled to the waveguide 1 and to a D.C. bias supply by means of a resonant cap structure comprising a thin circular disc or cap 5 and a post 6 which extends to an R.F. choke 7 mounted in a bore in the upper broad wall of the waveguide. The disc 5 is in contact with the upper terminal of the diode and extends parallel to the broad walls of the waveguide. The R.F. choke 7 comprises successive sections of alternately larger and smaller diameter, the larger-diameter sections being isolated from the waveguide housing at D.C. by a thin dielectric layer (not shown) therebetween, and the lower face of the lowermost larger-diameter section being flush with the upper broad wall of the waveguide; the choke is dimensioned to have a cut-off frequency below the fundamental frequency of oscillation.

As so far described, the oscillator closely resembles known millimeter-wave oscillators. When a suitable bias voltage is applied to the Gunn diode 3 via the choke 7, the diode generates microwave energy both at a fundamental frequency $f_o$ and at a second harmonic frequency $2f_o$ (and possibly also at higher harmonic frequencies), the values of the frequencies being mainly dependent on the resonant cap structure and particularly on the diameter of the disc 5; the position of the short-circuit 2 has little effect on the values of the frequencies but is adjustable to optimize the power output at $2f_o$.

The oscillator further comprises an electric probe 8 extending linearly in the waveguide 1 so as to be adjacent the disc 5. In this embodiment, the probe extends from and normal to one of the narrow walls of the waveguide, above the disc 5 (i.e. on the side thereof remote from the Gunn diode 3), and longitudinally intermediate the short-circuit 2 and the transverse plane of the Gunn diode so as to be close to the periphery of, and parallel to, the disc. The probe can be used to couple to the diode 3, via the resonant cap structure, a locking signal supplied along a further waveguide 9. The waveguide 9 extends parallel to the waveguide 1 and is of larger rectangular cross-section, with the broad walls of waveguide 9 being parallel to the narrow walls of waveguide 1; the waveguide 9 has a cut-off frequency below the fundamental frequency $f_o$ of the Gunn diode 3 mounted in the waveguide 1. The relative positions of the two waveguides are such that the probe 8 projects into the waveguide 9 in a central E-plane thereof, extending to the centre of the waveguide 9. Where the probe passes through the common wall of the two waveguides, it forms the central conductor of a coaxial line having longitudinally-successive portions 10 and 11 in which the outer conductor has larger and smaller diameters respectively. The portion 10 of the coaxial line has an impedance of 50 ohms, while the adjacent portion 11 extending to the narrow wall of the waveguide 1 has a much lower impedance. This latter portion 11 of the coaxial line is approximately a quarter wavelength long at the second harmonic frequency $2f_o$ so that at that frequency, the 50 ohms impedance of portion 10 is transformed to a very low impedance at the wall of the waveguide 1 and thereby inhibits the leakage of energy at the frequency $2f_o$ from the waveguide 1. The waveguide 9 is terminated in a fixed short-circuit 12 at a distance beyond the probe 8 which is about a quarter-wavelength at the fundamental frequency $f_o$.

In operation, a locking signal is supplied along the waveguide 9 in the direction of the arrow 13 (FIG. 2) at a frequency which is at or fairly close to the fundamental frequency $f_o$ of the oscillator in the absence of the locking signal. (This free-running fundamental frequency is dependent on, inter alia, the extent to which the probe 8 projects into the waveguide 1.) Energy at a frequency which is twice that of the locking signal will then propagate along the waveguide 1 in the direction of the arrow 14. If the frequency of the locking signal is varied, the harmonic frequency $2f_o$ will remain locked to twice the locking signal frequency over a tuning or locking range $\Delta(2f_o)$ which increases as the power of the locking signal in waveguide 9 increases and as the extent to which the probe 8 projects into the waveguide 1, and hence the magnitude of the coupling to the resonant cap structure, increases.

Figure 3:
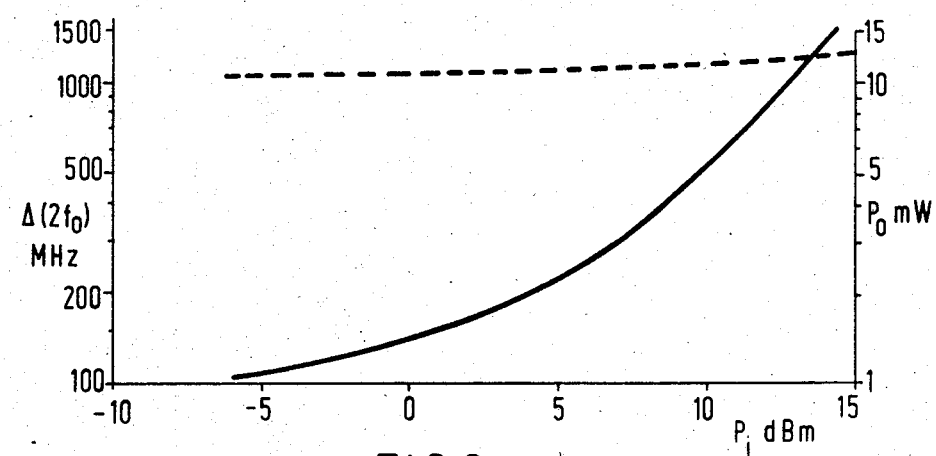
FIG. 3 is a graph of locking or tuning range and of second harmonic frequency output power against injected locking signal power.
Figure 4:
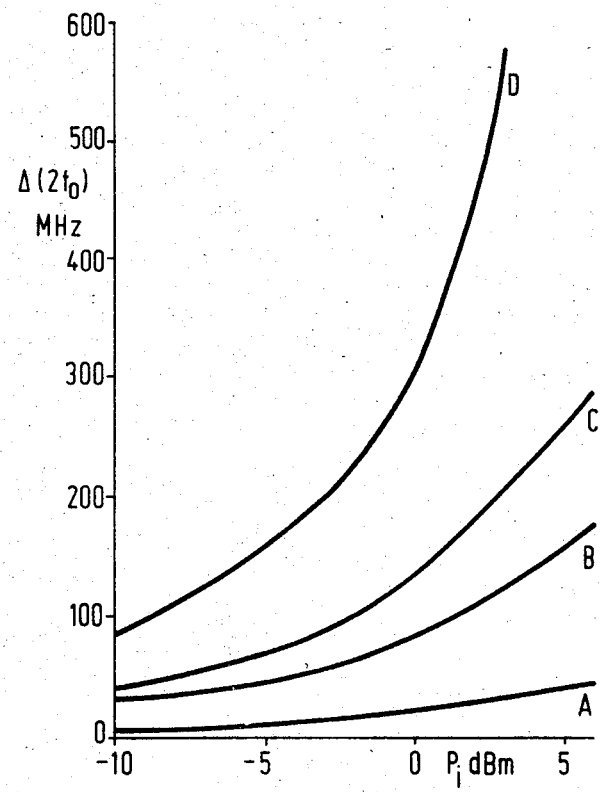
FIG. 4 shows further curves of locking range against injected locking signal power.

An embodiment of the invention of the form shown in FIGS. 1 and 2 has been constructed with an oscillator waveguide size WG 26 (WR 12), which has a cut-off frequency of about 48 GHz, and a locking signal supply waveguide size WG 22 (WR 28). The Gunn diode was a Plessey TE0141 device, which is intended for operation at a fundamental frequency of about 35 GHz. Various values of the diameter of the disc 5 and of the extent to which the probe 8 projected into the waveguide 1 were used; the value of the free-running second harmonic frequency depended on both these parameters. The probe 8, which had a diameter of 0.5 mm, was disposed 0.9 mm above the lower broad wall of the waveguide and 1.25 mm from the transverse plane of the Gunn diode; the upper surface of the disc 5, which had a thickness of about 100 μm, was disposed 0.45 mm above the lower broad wall of the waveguide. The diameter of the post 6 was 0.5 mm. FIG. 3 shows by way of example the variation with the power $P_i$ of the locking signal in the waveguide 9 of the tuning range $\Delta(2f_o)$ (plotted on a logarithmic scale: solid line) over which the oscillator remained locked to the injected signal, and of the average power output $P_o$ at $2f_o$ (dashed line). There was little variation in the output power $P_o$ over each tuning range. The free-running value of the second harmonic frequency was 85.9 GHz; the diameter of the disc 5 was 2.15 mm, and the probe 8 projected 2.2 mm into the waveguide 1. FIG. 4 shows, with a somewhat different range of values of the injected locking signal power $P_i$ and with a disc 5 of diameter 2.5 mm, the variation of the tuning range $\Delta(2f_o)$ with four different values of probe projection into the waveguide: A: 0 mm (giving a free-running second harmonic frequency of 79.7 GHz); B: 0.6 mm (78.7 GHz); C: 1.0 mm (77.7 GHz); D: 1.5 mm (74.8 GHz). If desired, the diameter of the disc 5 could be reduced to compensate for the tendency for the frequency to decrease with increasing probe projection into the waveguide.

To further improve the noise performance, the source of the locking signal may be phase-locked: this can be done much more readily at the lower frequency of this source than at the frequency of the oscillator embodying the invention if the latter has an output in the millimeter range.

Figure 5:
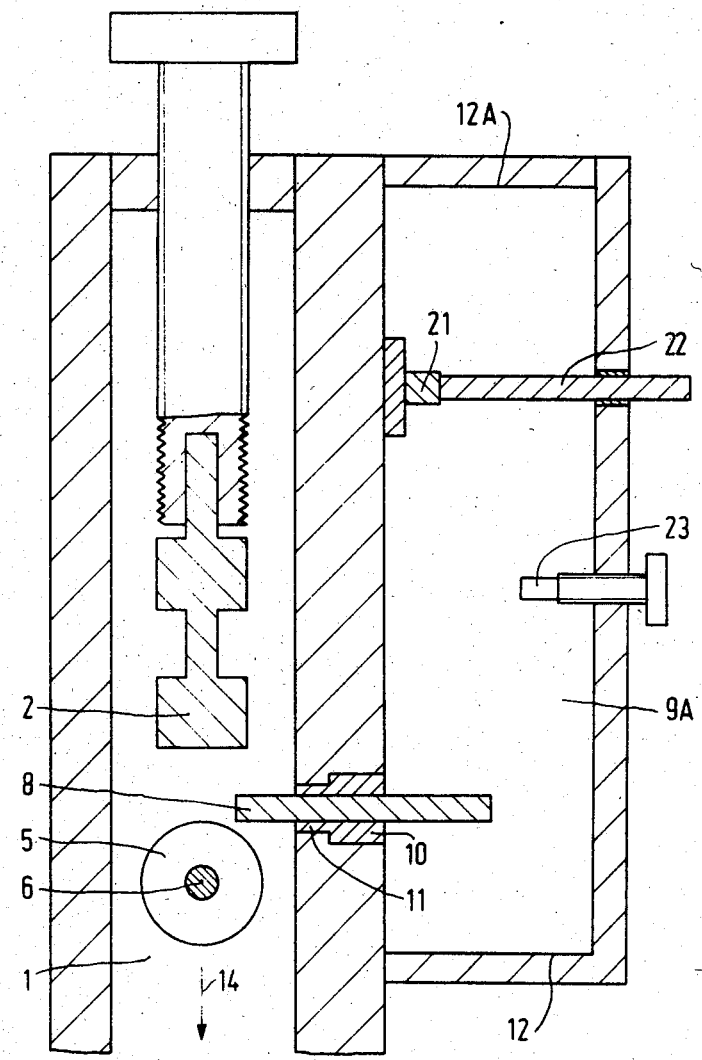
FIG. 5 is a longitudinal cross-sectional view, analogous to FIG. 2, of another oscillator embodying the invention.

Another embodiment of the invention is shown in longitudinal cross-section in FIG. 5 (a transverse cross-section would be similar to FIG. 1). In this case, the further waveguide 9A is terminated in a fixed short-circuit 12A at its end opposite to the short-circuit 12 to form a resonant cavity. A varactor diode 21 is disposed adjacent to that broad wall of the further waveguide 9A, a portion of which is common to a narrow wall of the waveguide 1; the diode is coupled to the broad wall both at D.C. and at R.F. The varactor diode is coupled to the resonant cavity at R.F. and is biased with a direct voltage by means of a conductive post 22 which extends through the opposite broad wall of the waveguide 9A and is insulated therefrom at D.C. The resonant cavity also has a dielectric tuning screw 23 for mechanically adjusting the resonant frequency of the cavity.

In a constructed embodiment of the form shown in FIG. 5, the second harmonic oscillator frequency of approximately 79 GHz could be varied by about 180 MHz by varying the bias on the varactor diode; over this tuning range, the second harmonic power output varied by ±0.5 dB. Contrary to a conventional cavity oscillator where the addition of a varactor diode to provide electronic tuning reduces the Q-factor of the oscillator, it was found that the addition of the varactor-tuned cavity resonator to the harmonic oscillator did not significantly affect the effective Q-factor of the oscillator at the second harmonic frequency, as determined from load-pulling measurements.

No attempt was made in this constructed embodiment to optimize the longitudinal position of the varactor diode in the resonant cavity. In another constructed embodiment, the varactor diode and post were omitted, and the fixed short-circuit 12A was replaced by a movable short-circuit. Adjustment of the position of this short-circuit to present at the probe 8 a range of reactances corresponding to the range of capacitances of a varactor diode gave a tuning range of some 500 MHz, and it is therefore expected that a similar tuning range should be obtained if the position of the varactor diode in the previously-mentioned constructed embodiment is optimized.

The non-linearity of the varactor tuning over a central 100 MHz portion of the tuning range was measured to be about 6%. The linearity might be improved by using two spaced varactor diodes in the resonant cavity in known manner.

In either of the embodiments described with reference to the drawing figures, the short-circuit 12 and/or 12A may be movable rather than fixed.

I claim:

1. A microwave oscillator comprising a waveguide having a cut-off frequency, the oscillator further comprising generating means, including a negative-resistance oscillator device, for generating microwave energy in the waveguide, wherein the generating means is operable to generate microwave energy simultaneously at a fundamental frequency which is below the cut-off frequency of the waveguide and at a harmonic frequency which is an integral multiple of the fundamental frequency and which is above said cut-off frequency, the generating means further comprising first means which in operation couples the oscillator device to the waveguide at said harmonic frequency and on which the values of said fundamental frequency and said harmonic frequency depend, characterised in that the oscillator further comprises second means, extending into the waveguide and being spaced from the first coupling means, for coupling microwave energy at said fundamental frequency from outside the waveguide to the first coupling means and thence to the oscillator device, to control the generation of microwave energy at said harmonic frequency.

2. An oscillator as claimed in claim 1 wherein the first coupling means comprises a resonant cap structure and wherein the second coupling means comprises an electric probe extending adjacent the cap.

3. An oscillator as claimed in claim 2 wherein the waveguide is rectangular, wherein the cap has a radial surface extending parallel to the broad walls of the waveguide, and wherein the probe extends into the waveguide from a narrow wall thereof, parallel to the broad walls.

4. An oscillator as claimed in claim 3 wherein the probe is spaced normal to the radial surface.

5. An oscillator as claimed in claim 4 wherein the cap is substantially a disc, wherein the oscillator device is disposed between one surface of the disc and one broad wall of the waveguide, wherein a post extends from the other surface of the disc to the other broad wall of the waveguide, the post having a substantially smaller cross-section parallel to the broad walls than the disc, and wherein the probe is disposed on the side of the disc remote from the oscillator device.

6. An oscillator as claimed in claim 1, 2, 3, 4 or 5 wherein the waveguide is terminated at one end by a short-circuit, wherein the generating means is spaced along the waveguide from the short-circuit, and wherein the second coupling means is longitudinally intermediate the generating means and the short-circuit.

7. An oscillator as claimed in claim 1, 2, 3, 4 or 5 wherein the second coupling means is adapted to inhibit the leakage of microwave energy at the harmonic frequency from the waveguide.

8. An oscillator as claimed in claim 1, 2, 3, or 5, and further comprising means for propagating a locking signal from a microwave source outside said waveguide to said second coupling means and thence via said first coupling means to the negative-resistance oscillator device, the frequency of the locking signal being approximately equal to the value of the fundamental frequency in the absence of the locking signal, said locking signal maintaining the harmonic frequency at said integral multiple of the frequency of the locking signal.

9. An oscillator as claimed in claim 8 in combination with said microwave source for generating the locking signal.

10. A combination as claimed in claim 9 wherein said microwave source is a varactor-tuned oscillator.

11. An oscillator as claimed in claim 1, 2, 3, 4 or 5, and further comprising a resonant cavity having means for varying the resonant frequency thereof, microwave energy at said fundamental frequency being operably coupled between said resonant cavity and said first coupling means by said second coupling means, and said resonant frequency being approximately equal to the value of said fundamental frequency in the absence of said resonant cavity, to maintain said harmonic frequency at said integral multiple of said resonant frequency.

12. An oscillator as claimed in claim 11 wherein the means for varying the resonant frequency of said resonant cavity comprise a varactor diode.

13. An oscillator as in claim 8 where said means for propagating a locking signal comprises a second waveguide into which said second coupling means extends, said second waveguide having a cut-off frequency below said fundamental frequency.

14. An oscillator as in claim 13 where said second waveguide is rectangular, where a narrow wall of the waveguide in which the microwave energy is generated by the oscillator device is adjacent a broad wall of the second waveguide, and where said second coupling means extends through said adjacent walls.

15. A combination as in claim 9 where said means for propagating a locking signal comprises a second waveguide into which said second coupling means extends, said second waveguide having a cut-off frequency below said fundamental frequency.

16. A combination as in claim 15 where said second waveguide is rectangular, where a narrow wall of the waveguide in which the microwave energy is generated by the oscillator device is adjacent a broad wall of the second waveguide, and where said second coupling means extends through said adjacent walls.

* * * * *